United States Patent [19]

Pricer et al.

[11] Patent Number: 4,857,766
[45] Date of Patent: Aug. 15, 1989

[54] BIMOS INPUT CIRCUIT

[75] Inventors: Wilbur D. Pricer, Burlington; Francis W. Wiedman, Stowe, both of Vt.

[73] Assignee: International Business Machine Corporation, Armonk, N.Y.

[21] Appl. No.: 114,973

[22] Filed: Oct. 30, 1987

[51] Int. Cl.$^4$ .................. H03K 19/02; H03K 19/007; H03K 19/084
[52] U.S. Cl. ................................. 307/446; 307/443; 307/458; 307/475; 307/581
[58] Field of Search ............... 307/443, 446, 458, 475, 307/581

[56] References Cited

U.S. PATENT DOCUMENTS

| | | | |
|---|---|---|---|
| 3,739,238 | 6/1973 | Hara | 317/235 R |
| 3,827,034 | 7/1974 | Colaro | 307/279 |
| 3,955,269 | 5/1976 | Magdo et al. | 357/43 |
| 4,048,649 | 9/1977 | Bohn | 357/43 |
| 4,085,417 | 4/1978 | Ochi | 357/43 |
| 4,256,984 | 3/1981 | Kojima | 307/475 |
| 4,264,941 | 4/1981 | London | 307/304 |
| 4,314,267 | 2/1982 | Bergeron et al. | 357/73 |
| 4,437,171 | 3/1984 | Hudson et al. | 365/177 |
| 4,529,894 | 7/1985 | Chan et al. | 307/458 |

FOREIGN PATENT DOCUMENTS

| | | | |
|---|---|---|---|
| 2363577 | 6/1975 | Fed. Rep. of Germany | 357/43 |
| 56-15068 | 2/1981 | Japan | 357/43 |

OTHER PUBLICATIONS

IBM Technical Disclosure Bulletin, "Bipolar and FET Integration on a Common Chip", vol. 15, No. 12, May 1973.
"Transistor Schottky-Barrier-Diode Integrated Logic Circuit" IEEE Journal of Solid-State Circuits, vol. SC-4, No. 1, Feb. 1969.

Primary Examiner—John S. Heyman
Assistant Examiner—Margaret Rose Wambach
Attorney, Agent, or Firm—Sughrue, Mion, Zinn, Macpeak & Seas

[57] ABSTRACT

An ECL input circuit which receives an ECL input signal and which generates, in response to the input signal, a CMOS-compatible output signal. The input circuit includes a bipolar transistor, having its emitter region adapted to receive the ECL input signal, having its collector region coupled to a first current source, and having its base region connected to a second current source. The circuit further includes an output circuit which is coupled to the collector region of the bipolar transistor for providing the CMOS-compatible signal.

14 Claims, 2 Drawing Sheets

FIG. 3A  $E_{IN}$

VOLTAGE AT NODE B

VOLTAGE AT NODE A $V_{OUT}$

| TRANSISTOR 12 ON | TRANSISTOR 12 OFF | TRANSISTOR 12 ON |

VOLTAGE AT NODE B'

VOLTAGE AT NODE A'

OUTPUT OF CMOS INVERTER

BIMOS INPUT CIRCUIT

TECHNICAL FIELD

The invention relates in general to input circuits for field-effect transistor (FET) devices. More particularly, the invention relates to an input circuit which receives an emitter coupled logic (ECL) input signal, and generates, in response to the input signal, a complementary metal-oxide-semiconductor (CMOS) compatible output signal.

PRIOR ART

In the high speed circuitry area, and in particular, in the high performance random-access-memory (RAM) design area, it is important, for speed and current transient reasons, to reduce input voltage signal swings. Presently, transistor-transistor logic (TTL) input circuits are most commonly interfaced with CMOS integrated circuits for providing input signals to these integrated circuits. However, TTL circuits have relatively large input signal swings which necessarily reduce the operating speed of the CMOS circuits. In an effort to increase the operating speed of CMOS integrated circuits, it has been proposed to interface emitter-coupled logic (ECL) input circuits, which have relatively small input signal swings, with CMOS integrated circuits. Input circuits are known which interface ECL input circuitry with CMOS devices.

An example of such an ECL input circuit is shown in FIG. 1. The input circuit 1 was developed to provide ECL input compatibility for a standard FET circuit having an existing substrate supply on the chip. In this circuit, the ECL input signal has a voltage swing of between $-0.4$ volt and $+0.4$ volt. The input circuit 1 includes MOS transistors 2 and 4, and a current source 6 consisting of depletion MOS transistor 8. MOS transistor 8 is connected to transistors 2 and 4, and is adapted to receive a negative voltage supply ($-V$). Transistors 2 and 4 are both connected between the current source 6 and a standard FET circuit. The gate electrode of transistor 4 is adapted to receive a reference voltage Vref, such as 0 volts, and the gate electrode of transistor 2 is adapted to receive an ECL input signal Ein.

Although circuit 1 provides for an ECL input signal, the circuit operates at a relatively low performance level due to the lack of overdrive on MOS transistors 2 and 4. The low performance level is due, in general, to the fact that emitter-coupled logic is a variant of bipolar technology and, as such, is designed to operate with bipolar transistors rather than with MOS transistors. More specifically, the relatively small voltage range of ECL input signals (e.g. between $-0.4$ and $+0.4$ volt) is not compatible with MOS transistors which require larger voltage swings for high speed logic operation. As a result, MOS transistors 2 and 4 will lack sufficient overdrive to operate at at a high performance level.

Another example of an ECL input circuit is disclosed in U.S. Pat. No. 4,437,171. The ECL input circuit contains an ECL-to-MOS buffer which converts an ECL input signal to a CMOS-compatible signal. The ECL-to-MOS buffer includes a comparator (differential amplifier) which receives the ECL input signal and compares the ECL input signal with a reference potential. The result of this comparison is then coupled to a level shifter stage which shifts the level of the resulting compared signal. The level shifter is coupled to a current mirror stage for amplifying the shifted signal, thereby making the amplified signal MOS compatible.

Although this patent discloses an ECL input circuit for use in an MOS device, and provides overdrive by amplifying the input signal through the use of a current mirror stage, the circuit suffers from certain disadvantages. In particular, the circuit requires a number of complex circuit stages (e.g. biasing, comparing, shifting and mirror stages), and requires a negative voltage supply which is inconvenient to implement. The patent also discloses a bipolar transistor, which is simultaneously fabricated with the MOS memory integrated circuit, for generating a reference potential.

The input circuit of the present invention makes use of the fact that ECL is a variant of conventional bipolar technology, and that the inherent structural elements of a CMOS device allow for simultaneous fabrication of integral bipolar transistors on the same substrate as the CMOS device.

The following are examples of circuits which incorporate bipolar technology in CMOS circuit devices.

IBM Technical Disclosure Bulletin, Vol. 15, No. 12, May 1973, pgs. 3755-3756, by H. L. Kalter, discloses a circuit which provides integration of fast bipolar logic circuits and high-density FET memories on a common semiconductor chip. The circuit includes a bipolar logic family stage, a logic level-to-FET level converter stage, and a p-channel FET circuit. The bipolar logic family includes a first current switch having a pnp transistor connected at its emitter to a constant-current source, and connected at its collector to both a logic input terminal and to the base of a npn transistor. A second current switch is adapted to receive another logic input, and is coupled to the collector of the npn transistor. The converter includes a pnp transistor having its collector connected to the base of a npn transistor. The npn transistor has its emitter coupled to a 31 10 volt potential. The FET circuit contains two FETs, with one of the FETs having its source connected to the output terminal, and its drain and gate each connected to a $-10$ volt potential.

U.S. Pat. No. 4,264,941 discloses a protective circuit for an integrated circuit (IC) having an insulated gate FET. The protective circuit includes two bipolar input transistors each having its emitter coupled to an input signal, and a CMOS inverter which consists of one p-channel and one n-channel device. The bipolar transistors each provide a low impedance path between the input and the power supplies terminal so that the gate oxide of the MOS transistor is protected against rupture.

U.S. Pat. No. 4,048,649 discloses a semiconductor structure having a high density mixture of bipolar and unipolar active elements fabricated on the same chip.

As is apparent from the problems associated with the prior art ECL input circuits, (e.g. low performance levels, negative voltage requirements, and complicated circuit structures), there exists a continuing need for a high-performance ECL input circuit which is compatible with a CMOS integrated circuit. Further, there is a need for an ECL input circuit which does not require a negative voltage supply, and which is relatively simple in construction and operation.

SUMMARY OF THE INVENTION

It is thus an object of the present invention to provide an improved high performance ECL input circuit which can generate a CMOS compatible signal.

It is another object of the invention to provide an ECL input circuit for a CMOS circuit and which does not require a negative voltage supply.

It is still another object of the invention to provide an ECL input circuit for a CMOS circuit which is relatively simple in construction and operation.

These and other objects of the present invention are realized in an input circuit that receives an ECL input signal, and generates, in response to the input signal, a CMOS-compatible signal. The circuit includes a bipolar transistor, having its emitter region adapted to receive the ECL input signal, having its collector region coupled to a first current source, and having its base region connected to a second current source. The circuit further includes an output circuit which is coupled to the collector region of the bipolar transistor for providing the CMOS compatible signal.

BRIEF DESCRIPTION OF THE DRAWINGS

FIGS. 3A through 3D are wave diagrams representing the voltage at selected nodes of the circuit in FIG. 2.

DETAILED DESCRIPTION OF THE PREFERRED EMBODIMENTS OF THE INVENTION

Figure 1:
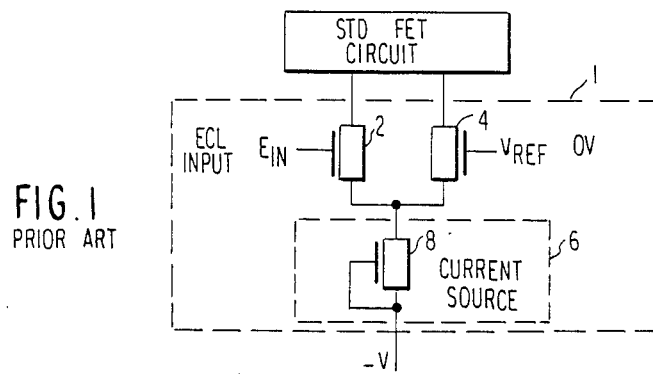
FIG. 1 is a part schematic and part block diagram of a prior art ECL input circuit.
Figure 2:
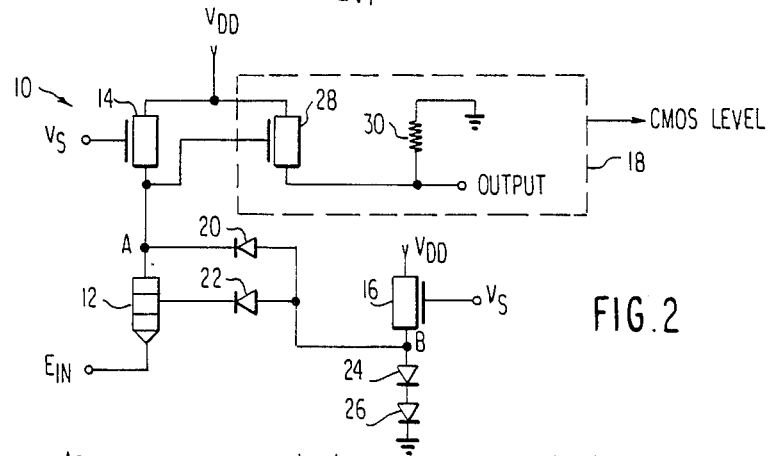
FIG. 2 is a schematic diagram of a first preferred embodiment according to the present invention.

In FIG. 2, there is shown the ECL input circuit according to one embodiment of the invention. The ECL input circuit 10 includes a bipolar npn transistor 12, two n-channel MOS transistors 14 and 16, an output circuit 18, and diodes 20, 22, 24 and 26 each having a forward bias Vf of about 0.7 volt. Those skilled in the art will understand that IC diodes 20, 22, 24 and 26 may be constructed from a bipolar transistor having its collector connected to its base.

The bipolar npn transistor 12 acts as the input transistor for the ECL input signal Ein. Since many CMOS integrated circuits can be adapted to include bipolar transistors, for example, by implanting one additional deep base (p-type) ion implant, circuit 10 can be easily fabricated on a single semiconductor substrate. The bipolar transistor 12 operates at a base to emitter voltage Vbe of about 0.7 volt, cuts off at a voltage Vbe of about 0.6 volt, and saturates at a voltage Vbe of between about 0.7 and 0.8 volt. The bipolar transistor 12 has its emitter region adapted to receive the ECL input signal Ein having an voltage range of between −0.4 volt and +0.4 volt. The bipolar transistor 12 has its base region coupled to the source region of MOS transistor 16 through diode 22, and has its collector region coupled to the source region of MOS transistor 16 through diode 20. The configuration of diodes 20 and 22 having their cathodes connected to the collector and base regions of transistor 12, respectively, is commonly referred to as a "Baker clamp" (see IEEE Journal of Solid-State Circuits, Vol. SC-4, No. 1, pages 3–12, in an article by Yutaka Hayashi et al, February, 1969). The "Baker clamp" prevents transistor 12 from saturating by diode clamping its collector voltage so that the collector voltage cannot fall below its base voltage, as will be discussed below in relation to the operation of circuit 10.

Each of the n-channel MOS transistors 14 and 16 of circuit 10 has its drain region connected to a supply terminal Vdd, such as 5 volts, and its gate electrode is adapted to receive a "sense" voltage Vs. In addition, each of the MOS transistors 14 and 16 is sized so that each n-channel transistor acts like a small current source of about 50 μamps. The source region of MOS transistor 14 is connected to the collector of bipolar transistor 12, and the source region of MOS transistor 16 is connected to ground through diodes 24 and 26. The MOS transistor 16, along with diodes 24 and 26, forms a two diode reference voltage source of approximately +1.4 volts at node B since the forward bias voltage Vf of each of diodes 24 and 26 is about 0.7 volt. MOS transistors 14 and 16 both operate according to the voltage Vs applied to their respective gate regions. In the active or sense mode (e.g. when ECL inputs are to be "sensed"), the voltage Vs is high, for example Vdd, and n-channel transistors 14 and 16 both allow current to flow from their drain to source, resulting in the two current sources. Alternatively, in the inoperable or standby mode of circuit 10 (e.g. when the ECL inputs are not to be "sensed"), voltage Vs is low, for example 0 volts, and n-channel transistors 14 and 16 are both off. More specifically, when the gate voltage of MOS transistors 14 and 16 falls below a threshold voltage Vth of about 2 volts, no current flows in the channel between the source and drain of transistors 14 and 16. Alternatively, when the gate voltage is sufficiently positive above Vth, n-type carriers flow from source to drain (corresponding to a positive current flow from drain to source). In this manner, when the sense voltage Vs is above about 2 volts, n-channel MOS transistors 14 and 16 each act like small current sources.

In FIG. 2, the output circuit 18 provides an output signal Vout of either Vdd or 0 volts to a CMOS input level. The output circuit 18 includes a p-channel MOS transistor 28 having its drain connected to ground through a load resistor 30, and having its source region connected to supply terminal Vdd. The gate electrode of transistor 28 is connected to the collector region of transistor 12 at node A. MOS transistor 28 acts like a switch having an ON and OFF mode. In the ON mode (node A is below about 3 volts), supply terminal Vdd is connected to the load resistor 30 so that the output voltage signal Vout across resistor 30 is almost Vdd. In the OFF mode (node A is above about 3 Volts), transistor 28 provides an open circuit across its channel so that the output voltage signal Vout across resistor 30 is 0 volts.

The operation of the circuit 10 will now be described in detail below with reference to the wave diagrams of FIGS. 3A through 3D.

As indicated above, in the standby or inoperable mode of circuit 10, the voltage supplied to each gate electrode of MOS transistors 14 and 16 is 0 volts. In this standby mode, nodes A and B, which are located at the collector region of transistor 12 and the source region of transistor 16, respectively, float, since no current flows in the channels of MOS transistors 14 and 16. In order for circuit 10 to be in an active or operable mode for "sensing" an ECL. input signal Ein, a high voltage level of Vs, of approximately 5 volts, is applied to each gate of MOS transistors 14 and 16 so that current flows in their respective channels.

With reference to FIGS. 3A through 3D, there are shown wave diagrams representing the ECL input signal Ein, the voltages at nodes A and B, and the output voltage Vout of circuit 10. It should be understood that the wave diagrams of FIGS. 3A through 3D, and those of FIGS. 5A through 5D, represent approximate voltage values for illustration purposes only, and that the rise and fall times of the voltages will depend, inter alia, on the components selected for constructing the circuits.

At time t0, ECL input signal Ein (FIG. 3A) is shown to be at its low level of −0.4 volt. At this time, transistor 12 is ON, and diodes 20 and 22 are forward-biased. Node B has a voltage of 1.0 volt, and node A has a voltage of 0.3 volt, since voltage Vbe of transistor 12 is 0.7 volts and the forward bias of each of diodes 20 and 22 is 0.7 volt. MOS transistor 28 is ON since the voltage at node A (0.3 volt) is below 3 volts, thereby causing the output voltage Vout across resistor 30 to be about Vdd or 5 volts.

Figure 3B:
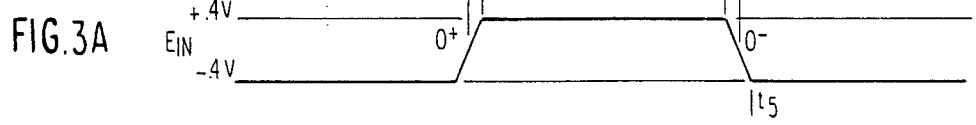
Figure 3B:
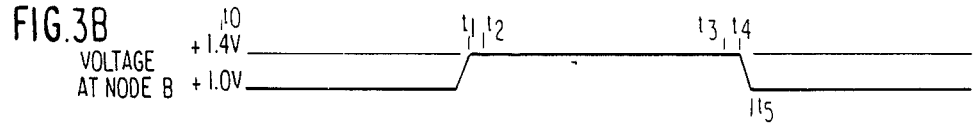

With reference to time t1, where the input signal Ein of FIG. 3A is shown to be above approximately 0 volts, transistor 12 is OFF, diodes 20 and 22 are reverse-biased, and diodes 24 and 26 are forward-biased, as node B (FIG. 3B) is equal to the two-diode drop voltage supply of about 1.4 volts. At this time, no current flows out of the collector of transistor 12 or through diodes 20 or 22, thereby causing node A to be pulled up through MOS transistor 14 to the supply voltage Vdd of approximately 5 volts. Accordingly, at time t1, FIG. 3C shows the voltage at node A to be in an upward swing towards 5 volts.

As indicated above, the p-channel MOSFET 28, which has its gate coupled to node A, controls the output voltage Vout of circuit 10. When node A swings up to approximately 3 volts, transistor 28 turns OFF as no current flows through its channel. As a result, the output voltage Vout across the load resistor 30 swings to ground or 0 volts as shown in FIG. 3D.

Figure 3C:
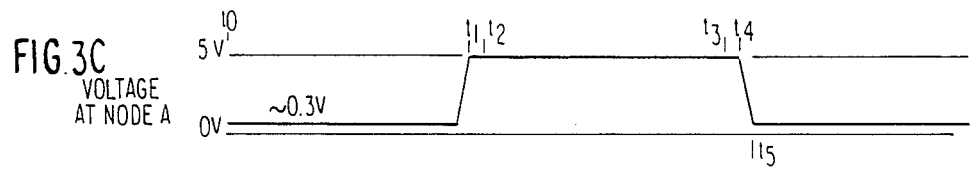
Figure 3D:
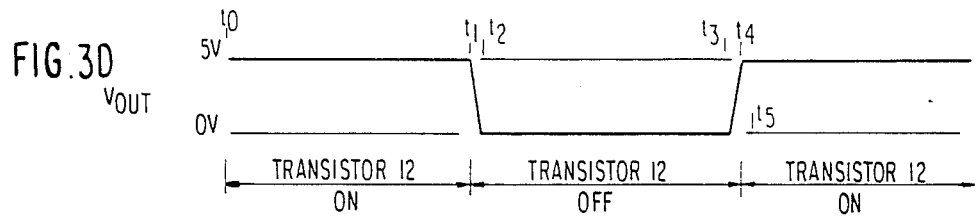

As the ECL input signal Ein increases to its high input level of +0.4 volts, as shown in FIG. 3A at the time period between t2 and t3, node A will be pulled up through MOS transistor 14 to the supply potential voltage Vdd (5 volts) as shown in FIG. 3C. As a result, transistor 28 will remain OFF, and the output voltage Vout will remain at 0 volts as shown in FIG. 3D. Since transistor 12 is OFF, and diodes 20 and 22 are each reverse-biased, the two-diode drop voltage source of 1.4 volts is formed at node B (FIG. 3B).

With reference now to the time t4, where the ECL input signal Ein drops to a voltage of approximately 0 volts transistor 12 turns on, as its base-to-emitter voltage Vbe becomes 0.7 volt, and diode 22 is forward-biased, thereby causing current to flow into the base of transistor 12 through diode 22. Although current flows into the base of transistor 12 at time t4, there is some delay before current flows into the collector of transistor 12. When a substantial amount of current starts to flow in the collector of transistor 12, the voltage at node A begins to fall since current I1 from current source 14 is now counterbalanced by the current in the collector of transistor 12. When the voltage at node A falls below about 3 volts, p-channel MOS transistor 28 turns on, causing supply voltage Vdd to be connected to the load resistor 30. As a result, the output voltage Vout across resistor 30 becomes almost Vdd or 5 volts as shown in FIG. 3D.

As the voltage at node A continues to fall to a voltage of about 0.7 volt, diode 20 becomes forward-biased. As a result, current, which was initially flowing from node B through diodes 24 and 26, is diverted through diode 20. The diversion of current from node B through diode 20 effectively "clamps" the collector voltage of transistor 12 so that it cannot drop lower than its base voltage, thereby preventing transistor 12 from saturating. More particularly, as Ein swings to its low level of −0.4 volt at time t5, the voltage at the base of transistor 12 drops to a voltage of about 0.3 volt as the voltage at node B drops to about 1.0 volt. The voltage at the collector of transistor 12 (node A) at time t5 is "clamped" at 0.3 volt thereby preventing the collector voltage of transistor 12 from dropping below the base voltage (0.3 volt) of transistor 12. As a result, transistor 12 is prevented from saturating.

Figure 4:
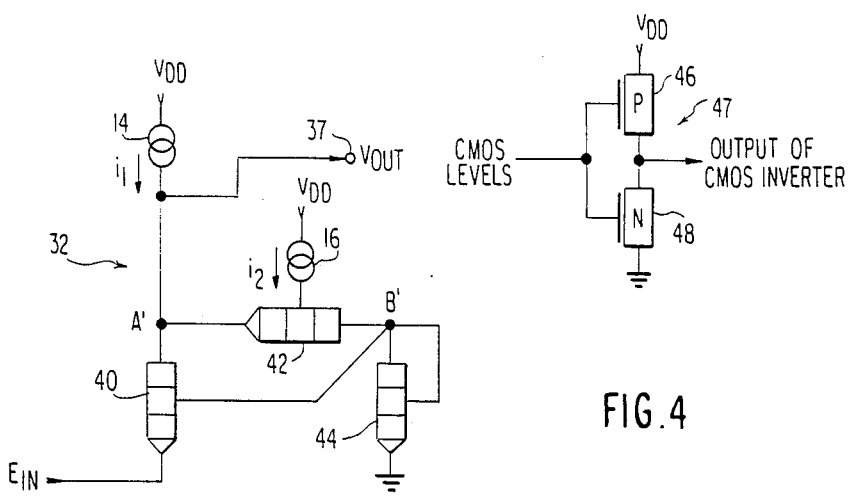
FIG. 4 is a schematic diagram of a second preferred embodiment of the invention.

In FIG. 4 there is shown a second preferred embodiment of the invention. The ECL input circuit 32 includes two current sources 14 and 16, an output terminal 37 which is coupled to a CMOS inverter 38, and three npn bipolar transistors 40, 42 and 44.

The bipolar npn transistor 40 serves as the ECL input transistor, and has its emitter adapted to receive an ECL input signal Ein. The input transistor 40 has its base connected to the collectors of bipolar transistors 42 and 44 at node B', and has its collector connected to the emitter of transistor 42 and to the current source 14 at node A'. Transistor 44 is wired as an IC diode, has its collector connected to its base and also to the collector of transistor 42 at node B', and has its emitter connected to ground. The base of transistor 42 is connected to the supply terminal Vdd through current source 16.

The CMOS inverter circuit 47 includes one p-channel transistor 46 and one n-channel transistor 48. The source terminal of the p-channel device is connected to supply terminal Vdd, and the source terminal of the n-channel device is connected to ground. The two voltage output levels of inverter circuit 47 are 0 V for a high level of node 37, and Vdd for a low level of node 37.

The operation of the ECL input circuit 32 of FIG. 4 will now be described below with reference to the wave diagrams of FIGS. 5A through 5D.

The circuit 32 of FIG. 4 operates in much the same manner as the embodiment of circuit 10. In FIGS. 5A through 5D, there are shown the ECL input signal Ein to circuit 32, the corresponding voltages at nodes A' and B', and the output voltage Vout of the circuit. At time t00, the ECL input signal Ein is shown to have its low input signal level of −0.4 volt. At this time, transistor 40 is ON, having a base voltage of about 0.3 volt (node B') and a base-to-emitter voltage Vbe of about 0.7 volt (node B'- Ein=0.7 volts). At time t00, the voltage at node A' is 0.3 volt (FIG. 5C), and diode 44 is non-conductive, since the voltage at node B' is 0.3 volts and the forward bias voltage Vf of diode 44 is 0.7 volt.

At time t01, input signal Ein rises to above about 0 volts (FIG. 5A), thereby causing bipolar transistor 40 to shut OFF as its base-to-emitter voltage Vbe is less than 0.6 volts. The transistor 42 behaves like a diode since the voltage at the base of transistor 42 is between about 1.4 or 1.5 volts, thereby causing the emitter junction of transistor 42 to be reversed- biased, and the collector junction of transistor 42 to be forward biased. The transistor 44 becomes forward-biased since the voltage at node B' is 0.7 volt and the forward bias voltage Vf of diode 44 is 0.7 volt. Since transistor 40 is OFF and the emitter junction of transistor 42 is reverse-biased, the current I1 from current source 14 at node A' has no counterbalancing current from the collector of transistor 40 or the emitter of transistor 42, thereby causing node A' to be pulled up through current source 14 to Vdd. As a result, the output of node A' (FIG. 5C) becomes Vdd or 5 volts.

During the time period between t01 and t02 the ECL input signal Ein rises to its high level of +0.4 volt. Since Ein is at +4 volt, node B' continues to remain at +0.7 volt, as diode 44 and the diode, formed by the collector junction of transistor 42, are each forward-biased. Node A' remains pulled through current source 14 to a voltage of 5 volts, since transistor 40 and the emitter junction remain reverse biased.

As the ECL input signal Ein falls to below approximately 0 volts at time t04, transistor 40 turns ON since its Vbe is 0.7 volt, its base voltage is 0.7 volt (node B'), and its emitter voltage is at ground. As Ein continues to become more negative, the voltage at node A' begins to fall, since a counterbalancing current from the collector of transistor 40 overcomes current I1. When the voltage at node A' drops to about 0.7 volt, transistor 42 turns ON as its emitter junction becomes forward-biased. When transistor 42 turns ON, the voltage at node B' will begin to drop below 0.7 volt, thereby reverse-biasing diode 44, as current initially flowing through diode 44 is diverted through transistor 42. As the current from node B' is diverted through transistor 42, the voltage at node A' will become clamped at a voltage of about 0.3 volt (FIG. 5C at time t05), as Ein reaches its low level voltage of −0.4 volt, and node B' decreases to 0.3 volt. As a result, transistor 40 remains out of saturation, since its collector voltage (node A') does not fall below its base voltage (node B').

Figure 5A:
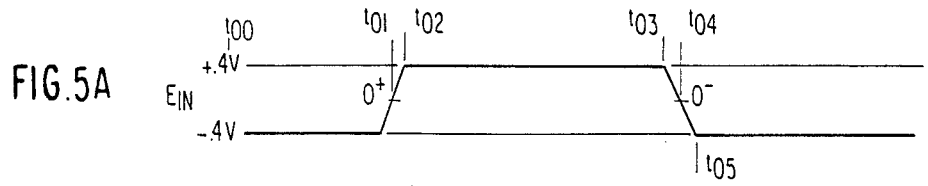
FIGS. 5A through 5D are wave diagrams representing the voltage at selected nodes of the circuit of FIG. 4.
Figure 5B:
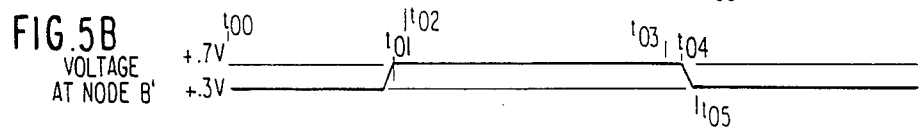
Figure 5C:
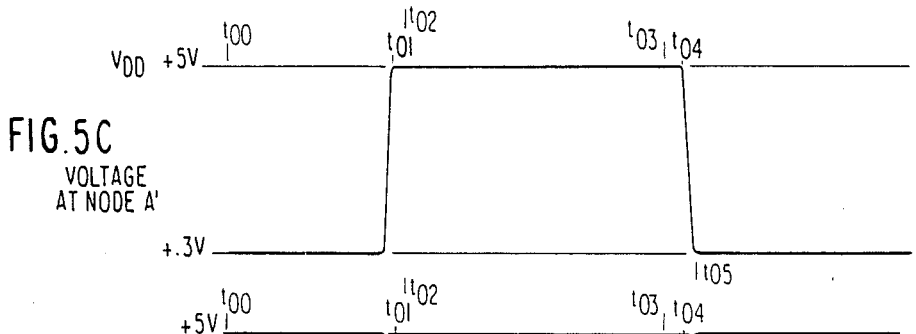
Figure 5D:
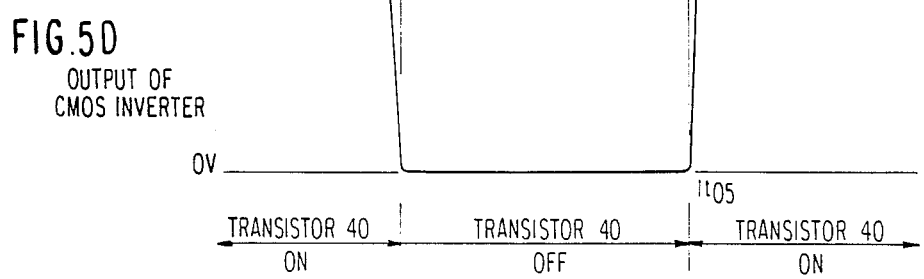

In FIG. 5D there is shown the output voltage of the CMOS inverter 47.

In conclusion, the circuits of FIGS. 2 and 4 provide output levels of either Vdd or 0 volts to a CMOS circuit in response to an ECL input signal. Since the total input voltage swing to the circuits is only 0.8 volts (between −0.4 and +0.4 volts), the circuit can supply a CMOS-compatible signal at a relatively high speed. Those skilled in the art will appreciate that circuits 10 and 32 of the invention allow for input transistors 12 and 40 to operate over a large $\beta$ range of between 1 to infinity and remain out of saturation. For example, if $\beta=1=$Ic/Ib=50/50, the current in the emitter is 100 microamps since Ie=Ib+Ic. On the other hand, if $\beta=$infinity, Ib would be zero, and Ic would be 100 microamps. If transistor 12 or 40 had as much collector resistance as 1 kilohm, the maximum drop in collector voltage would be (1 kilohm×0.1 milliamp)=0.1 volt, which is much less than would be required for the transistors to saturate. Further, when the input signal Ein drops below ground, for example, to −0.4 volt, the integrated circuit does not experience latch-up as the base and collector voltage of transistors 12 and 40 become +0.3 volt. Finally, circuits 10 and 32 both operate above ground, thereby eliminating the need for substrate bias, and both require only two current sources of about 50 micro amp in the operable mode, thereby having only minimum power requirements.

While several embodiments of the present invention have been herein described, it will be apparent to those skilled in the art that modifications may be made without departing from the invention. For example the CMOS inverter 47 of circuit 32 can be implemented in the embodiment of circuit 10, instead of the output circuit 18 of circuit 10 for providing a CMOS input level. It should be understood that the invention is limited only by the scope of the following claims.

What is claimed is:

1. An input circuit for receiving an ECL input signal and for generating, in response to the input signal, a CMOS-compatible output signal, comprising:
   a bipolar transistor having emitter, base and collector regions, the emitter region connected to receive the ECL input signal;
   first current source means coupled to the collector region of said bipolar transistor;
   second current source means coupled to the base and collector regions of said bipolar transistor; and
   output circuit means, directly connected to the collector region of said bipolar transistor, for providing the CMOS-compatible output signal.

2. The input circuit according to claim 1, further comprising output circuit means comprising a field effect transistor having a gate electrode connected to the collector region of said bipolar transistor.

3. An input circuit for receiving an ECL input signal and for generating, in response to the input signal, a CMOS-compatible output signal, comprising:
   a bipolar transistor having emitter, base and collector regions, the emitter region being connected to receive the ECL input signal;
   first current source means coupled to the collector region of said bipolar transistor;
   second current source means coupled to the base and collector regions of said bipolar transistor;
   output circuit means, connected to the collector region of said bipolar transistor, for providing the CMOS-compatible output signal; and
   first and second diodes;
   wherein said second current source means is coupled to the base and collector regions of said bipolar transistor through said first and second diodes, respectively.

4. The input circuit according to claim 1, further comprising output means comprising a field effect transistor having a gate electrode coupled to the collector region of said bipolar transistor; and a resistor connected in series with said field effect transistor.

5. An input circuit for receiving an ECL input signal and for generating, in response to the input signal, a CMOS-compatible output signal, comprising:
   a bipolar transistor having emitter, base and collector regions, the emitter region being connected to receive the ECL input signal;
   first current source means coupled to the collector region of said bipolar transistor;
   second current source means coupled to the base and collector regions of said bipolar transistor; and
   output circuit means, connected to the collector region of said bipolar transistor, for providing the CMOS-compatible output signal;
   wherein said first and second current source means include a n-channel transistor.

6. An input circuit for receiving an ECL input signal and for generating, in response to the input signal, a CMOS-compatible output signal, comprising:

a bipolar transistor having emitter, base and collector regions, the emitter region being connected to receive the ECL input signal;

first current source means coupled to the collector region of said bipolar transistor;

second current source means coupled to the base and collector regions of said bipolar transistor;

output circuit means, connected to the collector region of said bipolar transistor, for providing the CMOS-compatible output signal; and means for applying a reference voltage at the base region of said bipolar transistor.

7. The input circuit according to claim 3, further comprising means for supplying an ECL input signal to the emitter region of said bipolar transistor.

8. The input circuit according to claim 3, wherein said first and second diodes are npn type transistors, each of which has its base region connected to its collector region.

9. An input circuit for receiving an ECL input signal and for generating, in response to the input signal, a CMOS-compatible output signal, comprising:

a bipolar transistor having emitter, base and collector regions, the emitter region being connected to receive the ECL input signal;

first current source means coupled to the collector region of said bipolar transistor;

second current source means coupled to the base and collector regions of said bipolar transistor;

output circuit means, connected to the collector region of said bipolar transistor, for providing the CMOS-compatible output signal;

means for supplying a reference voltage at the base region of said bipolar transistor; and output means comprising:
- a field effect transistor having a gate electrode coupled to the collector region of said bipolar transistor; and
- a resistor connected in series with said field effect transistor.

10. The input circuit according to claim 6, wherein said reference voltage signal supplying means includes at least one diode.

11. An input signal circuit for receiving a signal from an ECL circuit and for converting the ECL signal to a CMOS-compatible signal, comprising first and second current source means; and first, second and third bipolar transistors, each having emitter, collector and base regions;

said second transistor having its base connected to said first current source means, its emitter region connected to the collector region of said first transistor, and its collector region of said first transistor, and its collector region connected to the base region of said first transistor and to the collector region of said third transistor;

said third bipolar transistor having it base region connected to collector region, and its emitter region connected to the ground;

said first transistor having its emitter connected to receive the ECL signal and having its collector region connected to said second current source means and to an output terminal for supplying the CMOS-compatible signal.

12. An input signal circuit for receiving a signal from a ECL circuit and for converting the ECL signal to a CMOS-compatible signal, comprising:

a bipolar transistor having emitter, collector and base regions;

first and second current sources, said first current source being connected to the collector region of said first bipolar transistor, and said second current source being connected to the base and collector regions of said bipolar transistor;

an input terminal, coupled to the emitter region of said bipolar transistor, for receiving the ECL signal; and output circuit means, directly connected to the collector region of said first bipolar transistor, for providing the CMOS-compatible signal.

13. The input circuit according to claim 12, further comprising a CMOS circuit for receiving the CMOS signal, said CMOS circuit and said bipolar transistor being integrated on a common semiconductor chip.

14. The input circuit according to claim 12, wherein said bipolar transistor is of npn type.

* * * * *